United States Patent
Cheon (10) Patent No.: US 9,881,814 B2
(45) Date of Patent: Jan. 30, 2018

(54) APPARATUS FOR MANUFACTURING SEMICONDUCTOR PACKAGE AND METHOD FOR MANUFACTURING SEMICONDUCTOR PACKAGE USING THE SAME

(71) Applicant: Samsung Electronics Co., Ltd., Suwon-si, Gyeonggi-do (KR)

(72) Inventor: Seungjin Cheon, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/983,524

(22) Filed: Dec. 29, 2015

(65) Prior Publication Data
US 2016/0240396 A1    Aug. 18, 2016

(30) Foreign Application Priority Data

Feb. 12, 2015 (KR) .......................... 10-2015-0021635

(51) Int. Cl.
| | |
|---|---|
| *H01L 21/56* | (2006.01) |
| *B29C 45/34* | (2006.01) |
| *B29C 33/10* | (2006.01) |
| *B29L 31/34* | (2006.01) |

(52) U.S. Cl.
CPC ............ *H01L 21/565* (2013.01); *B29C 33/10* (2013.01); *B29C 45/34* (2013.01); *B29L 2031/3406* (2013.01); *H01L 2224/16225* (2013.01); *H01L 2924/181* (2013.01)

(58) Field of Classification Search
CPC .............................. B29C 45/34; H01L 21/565
See application file for complete search history.

(56) References Cited

U.S. PATENT DOCUMENTS

| | | | |
|---|---|---|---|
| 5,665,281 | A | 9/1997 | Drummond |
| 6,444,157 | B1 | 9/2002 | Miyajima |
| 6,627,976 | B1 | 9/2003 | Chung et al. |
| 6,676,885 | B2 | 1/2004 | Shimizu et al. |
| 6,767,767 | B2 | 7/2004 | Hayashida et al. |
| 6,867,487 | B2 | 3/2005 | Huang et al. |

(Continued)

FOREIGN PATENT DOCUMENTS

| | | | |
|---|---|---|---|
| JP | 10092853 A | * | 4/1998 |
| JP | 2007152831 A | * | 6/2007 |

(Continued)

OTHER PUBLICATIONS

Partial machine translation of JP 10-092853A dated Apr. 1998 obtained from the espace website.*

*Primary Examiner* — Robert B Davis
(74) *Attorney, Agent, or Firm* — Renaissance IP Law Group LLP (57) ABSTRACT

The inventive concepts provide an apparatus for manufacturing a semiconductor package and a method for manufacturing a semiconductor package using the same. The apparatus includes a mold unit with a cavity formed by an inner space of the mold unit. The mold unit includes a first mold, a second mold coupled to the first mold, a supply part supplying a molding resin into the cavity, and a vent part disposed to be opposite to the supply part. The vent part includes a first vent part fixed in the mold unit, and a second vent part movable with respect to the first vent part.

19 Claims, 10 Drawing Sheets

(56) References Cited

U.S. PATENT DOCUMENTS

| | | |
|---|---|---|
| 6,969,640 B1 | 11/2005 | Dimaano, Jr. et al. |
| 7,186,589 B2 | 3/2007 | James et al. |
| 7,625,768 B2 | 12/2009 | Nishi et al. |
| 8,117,742 B2 | 2/2012 | Kuratomi et al. |
| 8,158,046 B2 * | 4/2012 | Brunnbauer ...... B29C 45/14639 264/272.17 |
| 8,338,236 B1 | 12/2012 | Low |
| 8,466,009 B2 | 6/2013 | Goller et al. |
| 8,535,981 B2 | 9/2013 | Ko et al. |
| 2001/0013674 A1 | 8/2001 | Shimizu et al. |
| 2002/0180024 A1 | 12/2002 | Huang et al. |
| 2003/0045030 A1 | 3/2003 | Hayashida et al. |
| 2005/0035435 A1 | 2/2005 | James et al. |
| 2006/0216867 A1 | 9/2006 | Kawata et al. |
| 2007/0292975 A1 | 12/2007 | Nishi et al. |
| 2010/0227436 A1 | 9/2010 | Goller et al. |
| 2010/0233857 A1 | 9/2010 | Kuratomi et al. |
| 2010/0276107 A1 * | 11/2010 | Gauermann ......... B22D 17/145 164/253 |
| 2012/0228753 A1 | 9/2012 | Ko et al. |
| 2012/0319245 A1 | 12/2012 | Low |
| 2013/0161800 A1 | 6/2013 | Byun et al. |

FOREIGN PATENT DOCUMENTS

| | | | |
|---|---|---|---|
| JP | 2013049253 A * | 3/2013 | |
| JP | 2014172287 A * | 9/2014 | |
| KR | 1020060102504 A | 9/2006 | |
| KR | 1020130071792 A | 7/2013 | |
| KR | 101451749 B1 | 10/2014 | |
| WO | WO 2008100146 A2 * | 8/2008 | ............. B29C 45/02 |

\* cited by examiner

APPARATUS FOR MANUFACTURING SEMICONDUCTOR PACKAGE AND METHOD FOR MANUFACTURING SEMICONDUCTOR PACKAGE USING THE SAME

CROSS-REFERENCE TO RELATED APPLICATION

This U.S. non-provisional patent application claims priority under 35 U.S.C. §119 to Korean Patent Application No. 10-2015-0021635, filed on Feb. 12, 2015, in the Korean Intellectual Property Office, the disclosure of which is hereby incorporated by reference in its entirety.

BACKGROUND

Embodiments of the inventive concepts relate to apparatuses for manufacturing a semiconductor package and methods for manufacturing a semiconductor package using the same. More particularly, embodiments of the inventive concepts relate to apparatuses for performing a molding process of a semiconductor package and methods for manufacturing a semiconductor package using the same.

A semiconductor package may protect a semiconductor chip from external environment and may physically and electrically connect the semiconductor chip to an electronic system. The packaging techniques may greatly affect performance of semiconductor devices as well as costs, performance and reliability of final products. A semiconductor package may be manufactured using at least one of various components such as a printed circuit board, a lead frame, and a circuit film to form electrical and/or physical connections. A bonding process, a wiring process, and/or a molding process may be used in the semiconductor package fabrication. If a void occurs in a molding layer during the molding process, stress may be caused in a semiconductor package by heat. The stress may cause defects (e.g., a crack) in a semiconductor package, so reliability of a semiconductor package may be deteriorated.

SUMMARY

Embodiments of the inventive concepts may provide manufacturing apparatuses capable of improving a molding process of a semiconductor package and methods for manufacturing a semiconductor package using the same.

In one aspect, an apparatus for manufacturing a semiconductor package may include a mold unit having a cavity corresponding to an inner space of the mold unit. The mold unit may include a first mold, a second mold coupled to the first mold, a supply part coupled to one side of the mold unit to supply a molding resin into the cavity, and a vent part coupled to another side of the mold unit opposite to the supply part to provide an exhaust path for air to exit the cavity. The vent part may include a first vent part fixed on the mold unit, and a second vent part movable with respect to the first vent part.

In an embodiment, the second vent part may be coupled to the first vent part in such a way that the first and second vent parts face each other or abut each other.

In an embodiment, the first mold may be an upper mold, and the second mold may be a lower mold. In this case, the first vent part may be provided at a side of the upper mold.

In an embodiment, a center of the first vent part may be closer to an edge of the cavity than a center of the second vent part in a main air exhausting direction.

In an embodiment, the second vent part may be movable with respect to the first vent part in a direction intersecting or substantially perpendicular to the main air exhausting direction.

In an embodiment, the first vent part may include a first opening having a first width in a direction substantially perpendicular to the main air exhausting direction, and the second vent part may include a second opening having a second width in the direction substantially perpendicular to the main air exhausting direction. The second width may be different from the first width. The second vent part may be movable between a standby position and a process position. The second opening may not overlap with the first opening when the second vent part is located at the standby position. The second opening may overlap with the first opening when the second vent part is located at the process position.

In an embodiment, the first opening may have a slit shape. The second opening may have a quadrilateral shape. One second opening or a plurality of second opening may be provided. The first width may be greater than the second width.

In an embodiment, the first width may be in a range of 80 μm to 100 μm, and the second width may be in a range of 25 μm to 40 μm.

In an embodiment, the first vent part may include a first opening having a slit shape, and the second vent part may include a rotatable rotation unit.

In an embodiment, the rotation unit may include a cam coupled on a cam shaft; a follower configured to rotate the cam; and a guide portion to guide the cam shaft moving between a standby position and a process position.

In an embodiment, the first opening and the cam may not overlap with each other when the cam shaft is disposed at the standby position. The first opening and the cam may overlap with each other when the cam shaft is disposed at the process position.

In an embodiment, the supply part may include a plunger to deliver the molding resin into the cavity.

In an embodiment, the mold unit may further include a control part controlling the supply part and the vent part. The control part may control the position of the second vent part in response to a position of the plunger.

In an embodiment, the plunger may be controlled to start delivering the molding resin and the second vent part may be controlled to be at the standby position when the first mold clamps a substrate provided in the cavity.

In an embodiment, after a predetermined time from the start of the supply of the molding resin, the second vent part may be moved from the standby position to the process position according to an instruction from the controller.

In an embodiment, the predetermined time may correspond to a time when an active area of a substrate is substantially covered with the molding resin. The active area may correspond to an area of the substrate on which a semiconductor chip is provided.

In an embodiment, the control part may control the plunger and the second vent part in such a way that the second vent part is located at the process position at the same time when the supply of the molding resin is substantially completed.

In an embodiment, the molding resin may be an epoxy molding compound (EMC).

In another aspect, a method for manufacturing a semiconductor package may include disposing a substrate including a semiconductor chip into a cavity of a mold unit, supplying a molding resin into the cavity to encapsulate the semiconductor chip and the substrate, and controlling a vent part to exhaust air existing in the cavity during the supply of the molding resin. Controlling the vent part may include controlling a position of a second vent part movable with respect to a first vent part according to an amount of the molding resin supplied into the mold unit.

In an embodiment, an opening of the first vent part may have a first width, and an opening of the second vent part may have a second width smaller than the first width.

In an embodiment, the air may be exhausted via an opening of the first vent part when the supply of the molding resin is started. After a predetermined amount of the molding resin is supplied, the second vent part may overlap with the first vent part to cover a portion of the first opening and the air may be exhausted via a portion of an uncovered first opening.

In an embodiment, the first vent part may include an opening having a slit shape, and the second vent part may include a rotation unit that is rotatable.

In still another aspect, an apparatus for manufacturing a semiconductor package may include a mold unit having a cavity corresponding to an inner space of the mold unit. The mold unit may include a first mold, a second mold coupled to the first mold, a supply part supplying a molding resin into the cavity, and a vent part disposed to be opposite to the supply part to exhaust air existing in the cavity. The vent part may include a first vent part disposed at a side of the cavity to clamp a substrate provided in the cavity, and a second vent part movable in a direction intersecting a main air exhausting direction. A distance between a center of the second vent part and an edge of the cavity may be greater than a distance between a center the first vent part and the edge of the cavity in the main air exhausting direction. The first vent part may include a first opening. The second vent part may include an adjusting portion that covers at least a portion of the first opening to change a cross-sectional area of an air exit opening that exhaust air from the cavity as the second vent part is moved along in the direction intersecting the main air exhausting direction.

In an embodiment, the first opening may have a first width measured in the direction substantially perpendicular to the main air exhausting direction. The adjusting portion may include a second opening having a second width measured in the direction substantially perpendicular to the main air exhausting direction and different from the first width. The second vent part may be movable between a standby position and a process position. The second opening does not overlap with the first opening in the main air exhausting direction when the second vent part is located at the standby position, and the second opening overlaps with the first opening in the exhausting direction of the air when the second vent part is located at the process position.

In an embodiment, the adjusting portion may comprise a rotatable rotation unit. The second vent part may be movable between a standby position and a process position. The rotation unit does not overlap with the first opening in the main air exhausting direction when the second vent part is located at the standby position, and the rotation unit overlaps with the first opening in the main air exhausting direction when the second vent part is located at the process position.

In another aspect, an apparatus for manufacturing a semiconductor package is provided. The apparatus may include a mold unit having a cavity corresponding to an inner space of the mold unit, a supply part disposed on one side of the mold unit and supplying a molding resin into the cavity to encapsulate a substrate and semiconductor chips disposed in the cavity; and a vent part disposed to another side of the mold unit opposite to the supply part to provide an exhaust path for air to exit the cavity, wherein the vent part includes a first vent part fixed in the mold unit and having a first opening; and a second vent part movable with respect to the first vent part. The first opening may form a first air exit opening when the second vent part is disposed at a standby position and an uncovered portion of the first opening may form a second air exit opening when the second vent part moves to a process position and covers a portion of the first opening. A cross-sectional area of the second air exit opening may be smaller than a cross-sectional area of the first air exit opening.

In an embodiment, the first opening may be located at a bottom portion of the first vent part that is adjacent to a top surface of the substrate. The second vent part may include a plurality of the second openings located at a bottom portion of the second vent part. A total cross-sectional area of the plurality of second openings may be smaller than a cross-sectional area of the first opening.

In an embodiment, the first opening has a quadrilateral shape and three edges of the first opening may be a portion of the first vent part, and each of the plurality of the second openings may have a quadrilateral shape and three edges of each of the plurality of second openings may be a portion of the second vent part.

In an embodiment, the first opening may have a quadrilateral shape and four edges of the first opening may be a portion of the first vent part, and each of the plurality of second openings may have a quadrilateral shape and four edges of each of the plurality of second openings may be a portion of the second vent part.

In an embodiment, the first opening may be located at a bottom portion of the first vent part that is adjacent to a top surface of the substrate and the second vent part may include a rotatable rotation unit. The rotation unit overlaps with the first opening in the main air exhausting direction at the process position.

BRIEF DESCRIPTION OF THE DRAWINGS

The inventive concepts will become more apparent in view of the attached drawings and accompanying detailed description.

DETAILED DESCRIPTION OF THE EMBODIMENTS

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1:
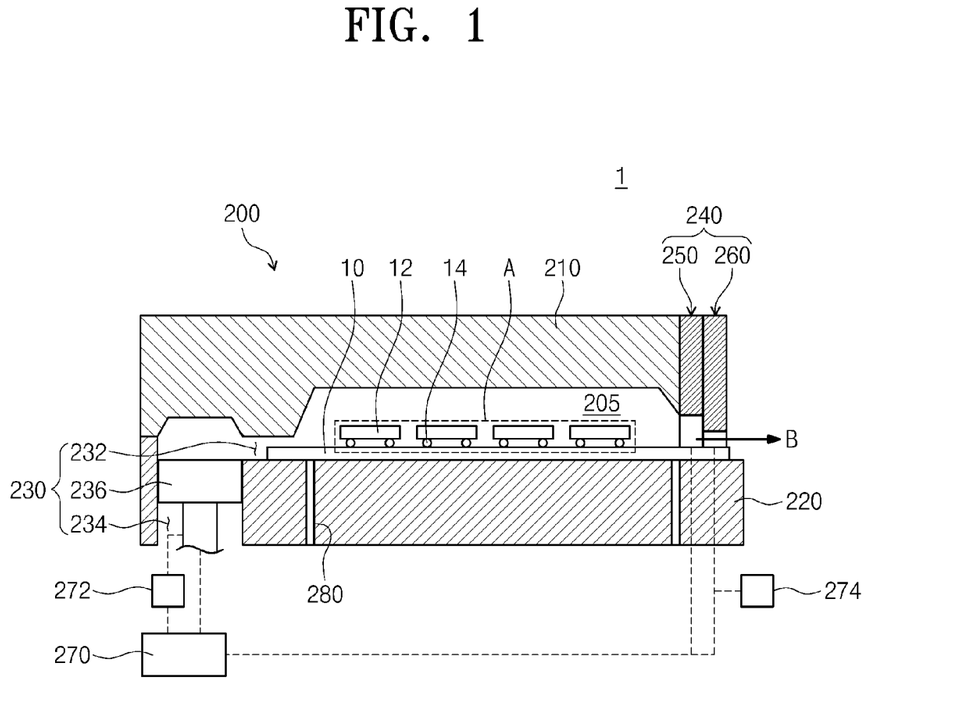
FIG. 1 is a schematic diagram illustrating an apparatus for manufacturing a semiconductor package according to some embodiments of the inventive concepts.

FIG. 1 is a schematic diagram illustrating an apparatus for manufacturing a semiconductor package according to some embodiments of the inventive concepts. Referring to FIG. 1, an apparatus 1 for manufacturing a semiconductor package may include a mold unit 200. Hereinafter, cross-section portions will be represented by hatching for convenience of illustration.

The mold unit 200 may include a first mold 210, a second mold 220, a supply part 230, a vent part 240, a control part 270, and a vacuum suction line 280. The first mold 210 and the second mold 220 may be coupled to each other to form a cavity 205. The cavity 205 may be defined by an inner space of the mold unit 200. The first mold 210 may be an upper mold 210, and the second mold 220 may be a lower mold 220. Alternatively, the first mold 210 may be a lower mold, and the second mold 220 may be an upper mold.

A substrate 10 and semiconductor chips 12 mounted on the substrate 10 may be provided in the cavity 205. The semiconductor chips 12 may be one of various kinds of semiconductor devices. The semiconductor chip 12 may include at least one connection terminal 14. The connection terminals 14 may be bonded to bonding pads of the semiconductor chips 12, respectively. The connection terminals 14 may be solder bumps used in a flip chip bonding technique. The substrate 10 may be a printed circuit board (PCB). In some embodiments, the substrate 10 may include a lead frame. Hereinafter, a region of the substrate 10, on which the semiconductor chips 12 are mounted, is defined as an active area.

The cavity 205 of the mold unit 200 may have a suitable size and shape to accommodate the configurations of the substrate 10 and the semiconductor chips 12.

The vacuum suction line 280 may be formed in the first mold 210 or the second mold 220. The vacuum suction line 280 may adsorb and fix the substrate 10 to the first mold 210 or the second mold 220 by means of a vacuum. Thus, even though a warpage phenomenon of the substrate 10 occurs due to heat, molding defects may be reduced or prevented.

The supply part 230 may be provided at a side of the mold unit 200. The supply part 230 may supply a molding resin into the cavity 205 to encapsulate the semiconductor chips and the substrate. In some embodiments, the supply part 230 may include a gate 232, a supply port 234, and a plunger 236. The supply port 234 may supply the molding resin from a molding resin source (not shown). In one embodiment, the supply port 234 may have a cylindrical-pipe shape. The gate 232 may provide a path or an opening through which the molding resin flows into the cavity 205. The plunger 236 may be movable in the supply port 234 and deliver the molding resin into the cavity as the plunge moves in a direction toward the cavity 205. In one embodiment, the plunger 236 may be moved by a first driving device 272 which moves the plunger 236 to a preset position according to a command or instructions from a control part 270 of the mold unit. At the preset position, a predetermined amount of the molding resin may be delivered to the cavity 205. The first driving device 272 may be a motor or a hydraulic power device or any suitable devices that can move the plunger 236 automatically.

The molding resin may be heated and supplied to the molding unit 200 in a gel state having certain viscosity. Alternatively, the molding resin may be melted and supplied to the molding unit 200 in a liquid state. In an embodiment, the molding resin may include an insulating polymer material such as an epoxy molding compound. In another embodiment, the molding resin may include at least one of other types of sealing materials.

The vent part 240 may be provided at another side of the mold unit 200. The vent part 240 may be disposed to be opposite to the supply part 230. In an embodiment, the vent part 240 may be disposed at a side of the upper mold 210. The vent part 240 may provide an exhaust path or an air exit opening for air to exit the cavity 205. The vent part 240 may include a first vent part 250 and a second vent part 260. The first vent part 250 may be fixed, and the second vent part 260 may be movable with respect to the first vent part 250. The first vent part 250 may be fixed on the upper mold 210. In some embodiments, the first vent part 250 may be provided at a side of the upper mold 210. In one embodiment, the first vent part 250 may partially define the cavity 205. In some embodiments, the first vent part 250 may fasten or clamp the substrate 10. For example, the first vent part 250 may press an edge area of the substrate 10 to fix the substrate 10. The edge area of the substrate 10 may be an area of the substrate 10 outside the active area. The first vent part 250 may be more adjacent to the cavity 205 than the second vent part 260 in a main air exhausting direction B. In other words, a distance between a center of the first vent part 250 and an edge of the cavity 205 may be shorter than a distance between a center the second vent part 260 and the edge of the cavity 205 in the main air exhausting direction B.

Figure 2:
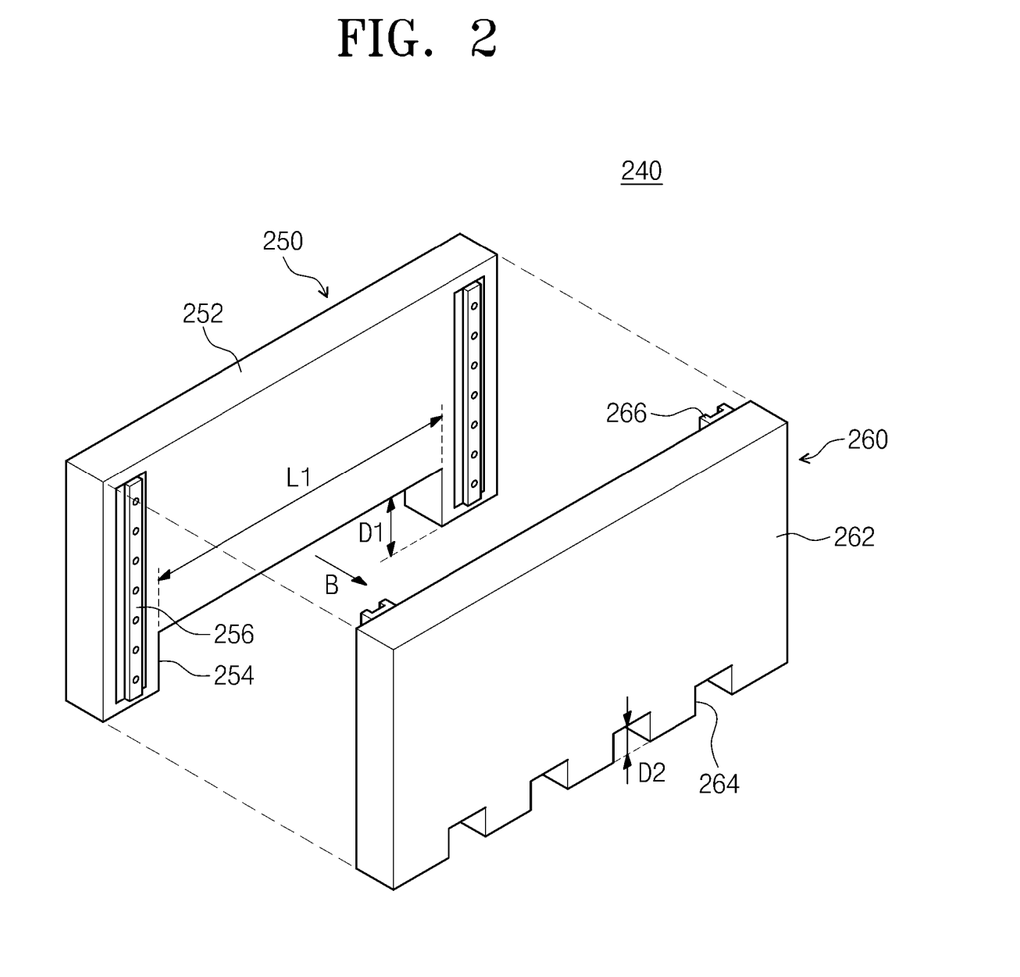
FIG. 2 is a diagram illustrating a vent part of FIG. 1 according to some embodiments of the inventive concepts.

FIG. 2 is a diagram illustrating a vent part of FIG. 1 according to some embodiments of the inventive concepts. Referring to FIGS. 1 and 2, the vent part 240 may include the first vent part 250 and the second vent part 260, as described above. The vent part 240 may exhaust the air in the cavity 205 when the molding resin is supplied into the cavity 205. The first vent part 250 and the second vent part 260 may face each other. The second vent part 260 may be coupled to the first vent part 250. The second vent part 260 may be coupled to the first vent part 250 by a coupling mechanism so that the second vent part 260 may be movable with respect to the first vent part 250. In one embodiment, the second vent part 260 may be movable with respect to the first vent part 250 in a direction substantially perpendicular to the main air exhausting direction B. In one embodiment, the second vent part 260 may be movable with respect to the first vent part 250 in a direction intersecting the main air exhausting direction B.

In some embodiments, the first vent part 250 may include a first body 252, a first opening 254, and a guide portion 256. A bottom surface of the first body 252 may be disposed on a top surface of the substrate 10. The first body 252 may be provided on one sidewall of the upper mold 210. The first body 252 may have a rectangular shape. In one embodiment, the first opening 254 may be formed in the first body 252 and may be recessed from the bottom surface of the first body 252 toward a central portion of the first body 252 such that three edges of the first opening are a portion of the first vent body 252. The first opening 254 has a first width D1 that is a distance between the bottom surface of the first body 252 and an edge of the first opening opposite the bottom surface of the first body 252. The first opening 254 has a first length L1 that is a distance between two opposite edges of the first opening. In one embodiment, the first width D1 may be in a range of 80 µm to 100 µm. The first opening 254 may have a slit shape. That is, the first length L1 is significantly greater than the first width D1. The guide portion 256 may be formed on one sidewall of the first body 252, which faces the second vent part 260. The guide portion 256 may extend in up and down directions, that is, in the direction substantially perpendicular to the main air exhausting direction B or in a direction perpendicular to the top surface of the substrate.

The vent part 260 may include a second body 262, one or more second openings 264, and a guide 266. A bottom surface of the second body 262 may face the top surface of the substrate 10. In one embodiment, the second body 262 may have a size substantially the same as that of the first body 252. The second body 262 may have a rectangular shape. The second opening 264 may be formed in the second body 262. The second opening 264 may be recessed from a bottom surface of the second body 262 toward a central portion of the second body 262 such that three edges of the second opening are a portion of the second vent body 262. The second opening 264 may have a quadrilateral shape. In some embodiments, the quadrilateral shape may be a square, a rectangular, a rhombus or a parallelogram. The second opening 264 may have a second width D2 which is a distance between the bottom surface of the second body 262 and an edge of the second opening opposite the bottom surface of the second body 262. The second width D2 may be different from the first width D1. In some embodiments, the second width D2 may be smaller than the first width D1. For example, the second width D2 may be in a range of 25 µm to 40 µm.

Figure 3:
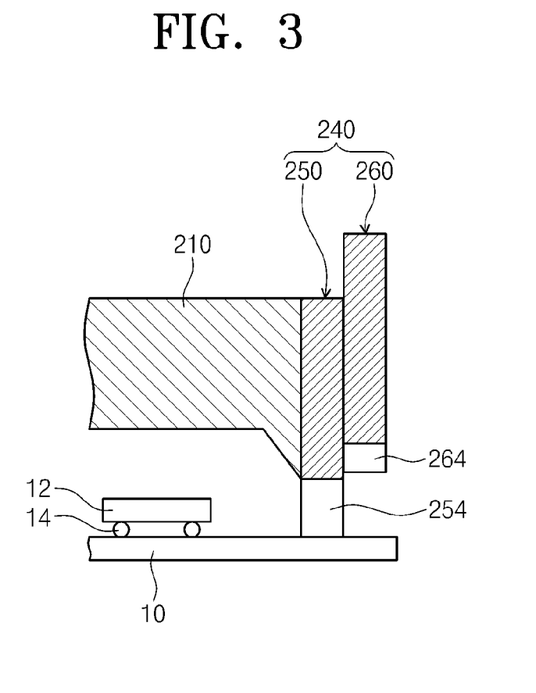
FIG. 3 is a diagram illustrating a second vent part of FIG. 2 located at a standby position.
Figure 4:
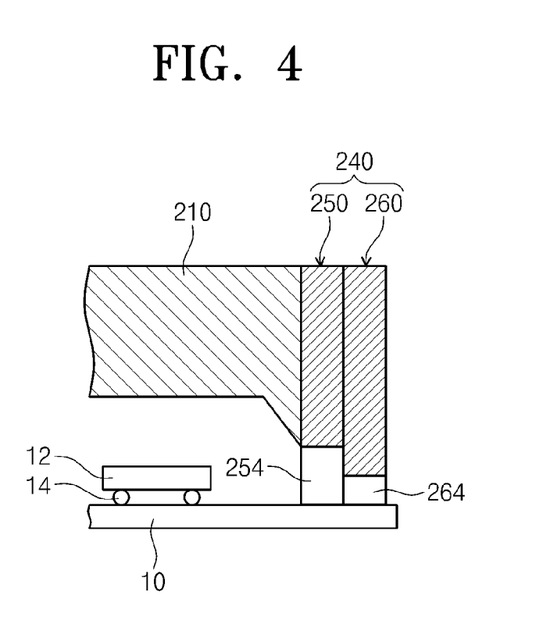
FIG. 4 is a diagram illustrating the second vent part of FIG. 2 located at a process position.

The guide 266 may be formed on one sidewall of the second body 262, which faces the first vent part 250. The guide 266 may be may be coupled to the guide portion 256, so the second vent part 260 may be movable along the guide portion 256 of the first vent part 250. It should be appreciated that the coupling mechanism between the first vent part and the second vent part is not limited to the guide portion and the guide as illustrated in FIGS. 2-4. Any suitable mechanisms may be used to move the second vent part relative to the first vent part to block or cover the first vent part or partially block or cover a first opening of the first vent part. For example, the second vent part may be inserted or slid from a side of the first vent part to block or cover the first opening by any suitable mechanism. In another example, the second vent part may be flipped over from the top, bottom, or one or more sides to block or cover the first opening by any suitable mechanism, such as a hinging mechanism.

The control part 270 may control operations of the supply part 230 and the vent part 240. For example, the control part 270 may control the positions of the first vent parts 250 relative to the second vent part 260 in response to a position of the plunger or an amount of the molding resin that have been delivered into the cavity. That is, the second vent part 260 may be disposed at a standby position or a process position depending on the operation condition of the molding process. In some embodiments, the second vent part 260 may be moved by a second driving device 274 according a command or instructions from the control part 270. The second driving device 274 may be a motor or a hydraulic power device or any suitable devices that can move the second vent part automatically.

FIG. 3 is a diagram illustrating the second vent part 260 of FIG. 2 located at a standby position. FIG. 4 is a diagram illustrating the second vent part 260 of FIG. 2 located at a process position. Referring to FIGS. 3 and 4, the second vent part 260 may be movable with respect to the first vent part 250. That is, the second vent part 260 may be movable between the standby position and the process position and be disposed at the standby position and the process position. At the standby position, the second vent part 260 may not change an air exit opening of the mold unit 200. As illustrated in FIG. 3, the second opening 264 does not overlap with the first opening 254 when the second vent part 260 is located at the standby position. For example, the second opening 264 and the first opening 254 may not overlap with each other in a direction substantially parallel to the main air exhausting direction. The main air exhausting direction may be a horizontal direction parallel to a top surface of the substrate 10. When the second vent part 260 is disposed at the standby position, a cross-sectional area of the first opening 254 may not be blocked or covered. That is, the first opening 254 may form a first air exit opening. At the process position, the second vent part 260 may change an air exit opening of the mold unit 200. As illustrated in FIG. 4, the second opening 264 overlaps with the first opening 254 when the second vent part 260 is located at the process position. For example, the second opening 264 and the first opening 254 may overlap with each other in the direction substantially parallel to the main air exhausting direction. When the second vent part 260 is disposed at the process position, a portion of a cross-sectional area of the first opening 254 may be blocked or covered by the second vent part 260. As a result, an uncovered first opening may form a second air exit opening having a cross-sectional area smaller than that of the first air exit opening. When the molding process is completed or substantially completed, the molding resin may outflow via the vent part. However, according to the inventive concept, the second vent part 260 may be controlled to be at process position. As the second air exit opening becomes smaller, a resistance to a flow becomes greater. Thus, an outflow of the molding resin through the second air exit opening may be minimized or prevented while the air may still be effectively exhausted, thus avoiding the formation of voids in the cavity 205.

In the above mentioned embodiment, the vent part 240 disposed at one side of the upper mold 210 is described as an example. However, the inventive concepts are not limited thereto. In other embodiments, the vent part 240 may be provided at another position of the mold unit 200. For example, the vent part 240 may be provided at one side of the lower mold 220. In still other embodiments, a plurality of the vent part 240 may be provided in the mold unit 200.

FIGS. 5 to 9 are diagrams illustrating a method for manufacturing a semiconductor package using the apparatus 1.

Figure 5:
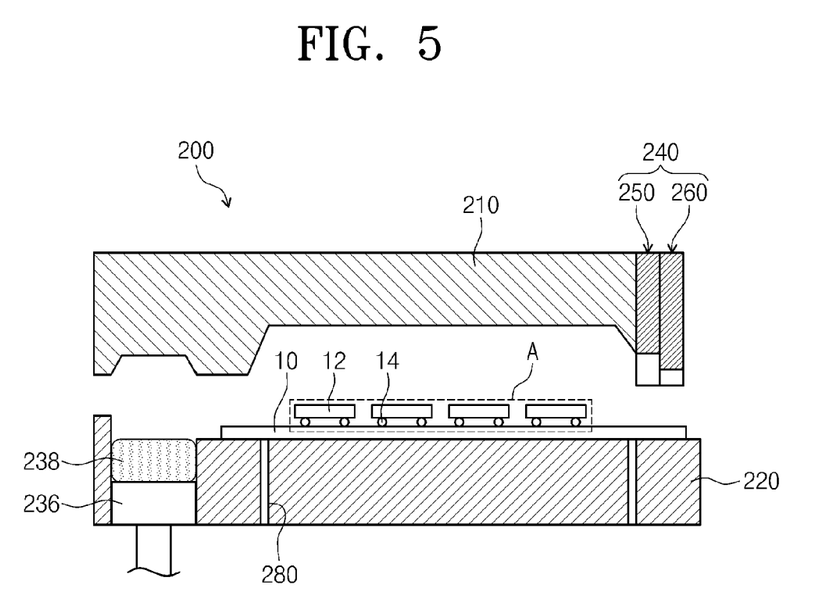
FIGS. 5 to 9 are diagrams illustrating a method for manufacturing a semiconductor package using the apparatus.

Referring to FIG. 5, the substrate 10 mounted with semiconductor chips 12 may be provided on the lower mold 220 and received on the lower mold 220. When the substrate 10 is received securely, the upper mold 210 may be disposed to cover the substrate 10 and the semiconductor chips 12. The substrate 10 may be fastened or clamped. In one embodiment, the first vent part 250 of the upper mold 210 may fasten or clamp the edge area of the substrate 10.

Figure 6:
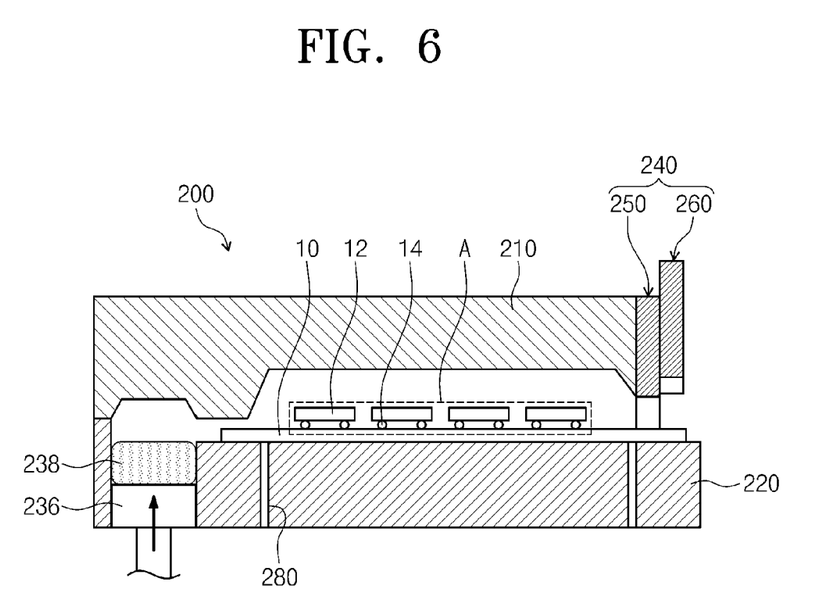

Referring to FIG. 6, the substrate 10 is clamped or fastened and, at the same time, the control part 270 may operate the plunger 236 to start the supply of the molding resin 238. In one example, the molding resin 238 may be an epoxy molding compound (EMC). The second vent part 260 may be raised up from the top surface of the substrate 10 with respect to the first vent part 250, so the second vent part 260 may be located at the standby position.

Figure 7:
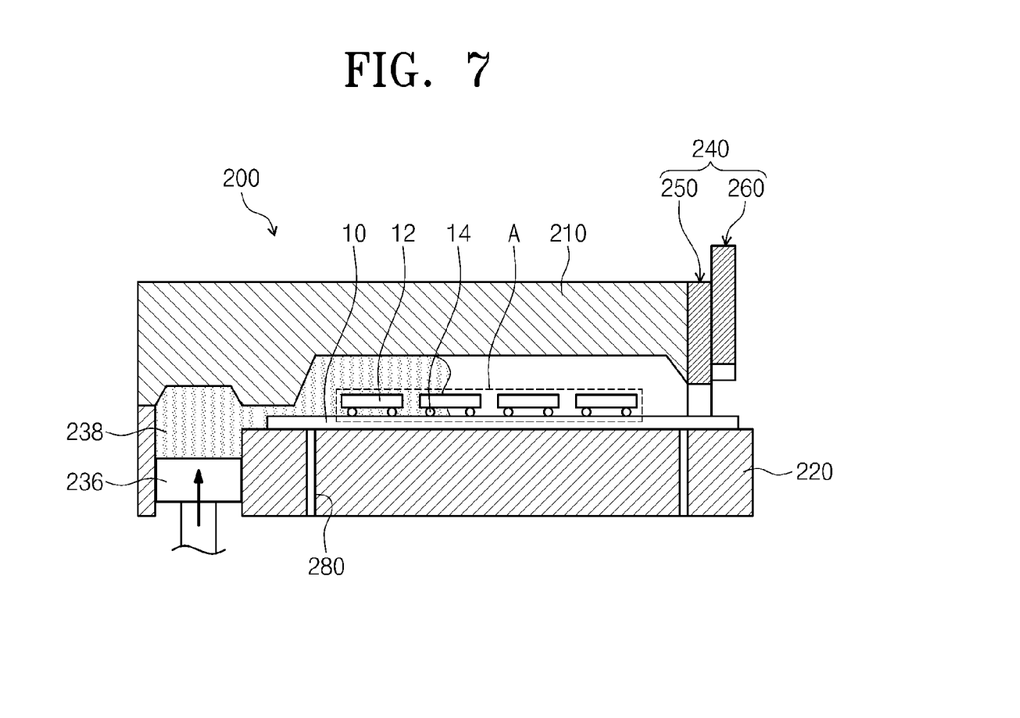

Referring to FIG. 7, the plunger 236 may apply pressure to the molding resin 238, and thus the molding resin 238 may be pushed or delivered into the cavity 205 to perform the molding process to encapsulate the semiconductor chips 12 and the substrate 10. The second vent part 260 may be disposed at the standby position during a predetermined time.

Figure 8:
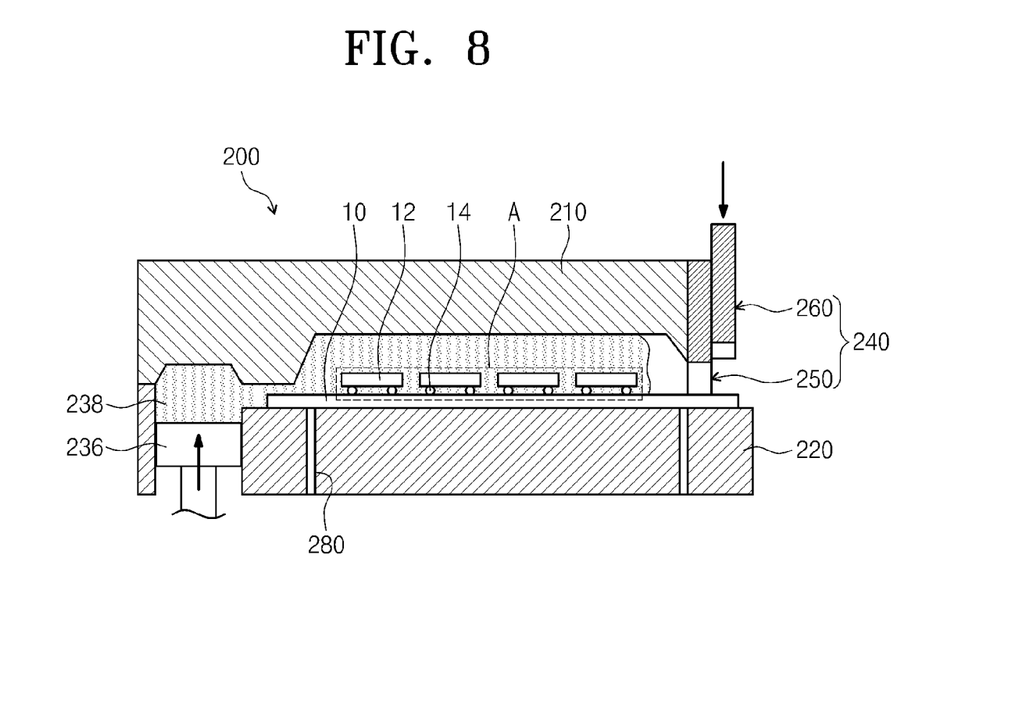

Referring to FIG. 8, after the predetermined time, the control part 270 may control to move the second vent part 260 from the standby position to the process position. In one embodiment, the control part may command the second driving device to move the second vent part 260 to the process position. In one embodiment, the predetermined time may be a time when the molding resin 238 substantially surrounds an entire portion of the active area of the substrate 10 in the cavity 205.

Figure 9:
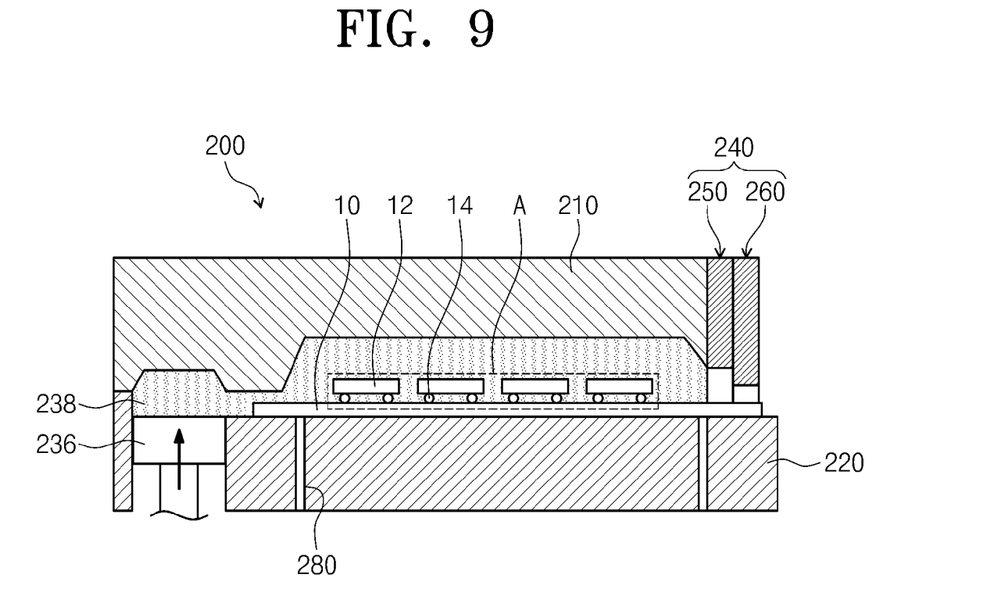

Referring to FIG. 9, when the supply of the molding resin 238 stops, the second vent part 260 is at the process position. After the supply of the molding resin 238 stops, the molding resin 238 may be hardened. Thereafter, the semiconductor chips 12 on the substrate 10 may be diced to complete a semiconductor packaging process.

Figure 10:
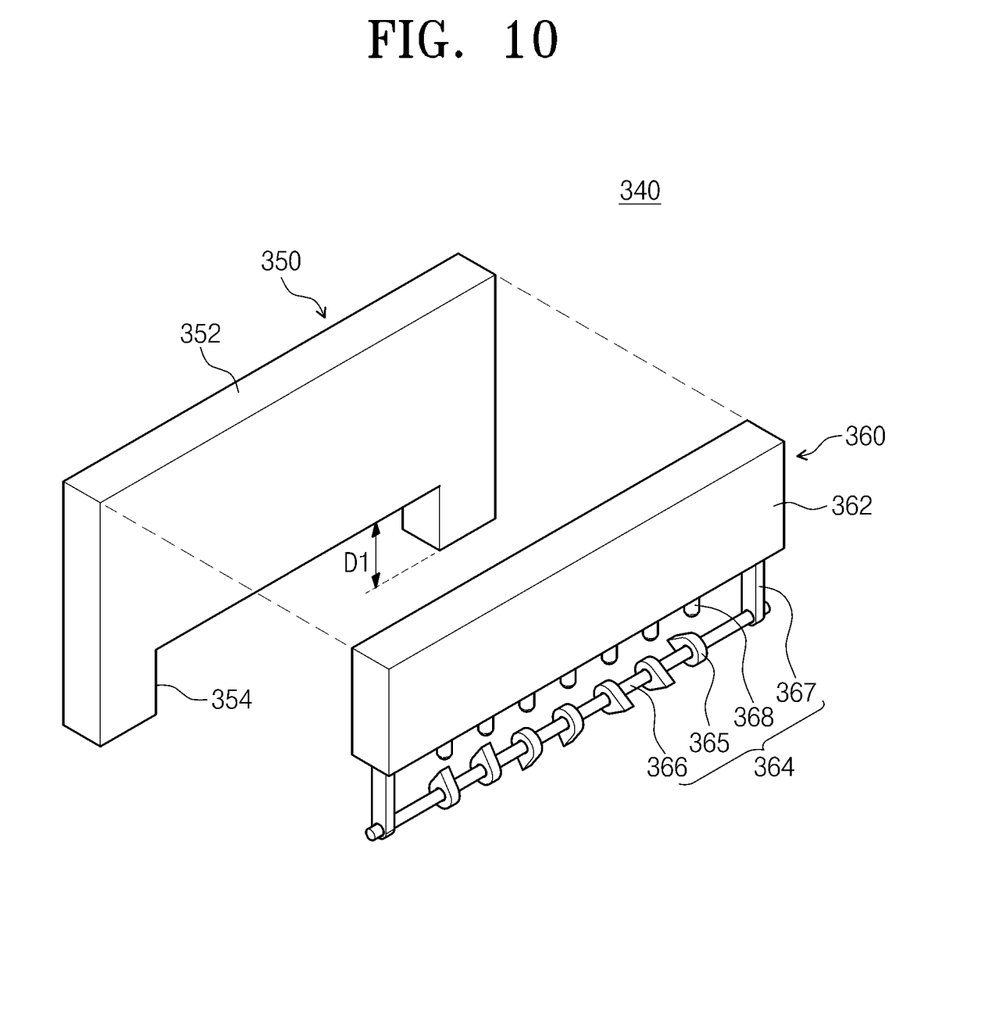
FIG. 10 is a diagram illustrating a vent part according to other embodiments of the inventive concepts.
Figure 11:
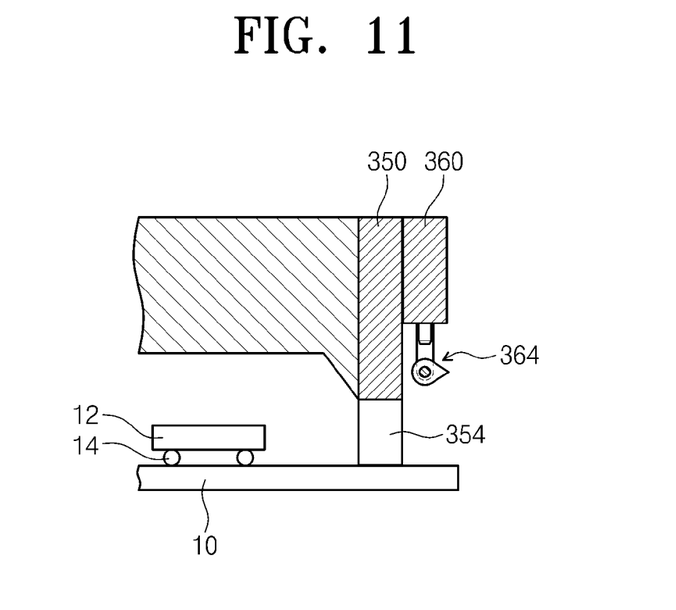
FIG. 11 is a diagram illustrating a second vent part of FIG. 10 located at a standby position.
Figure 12:
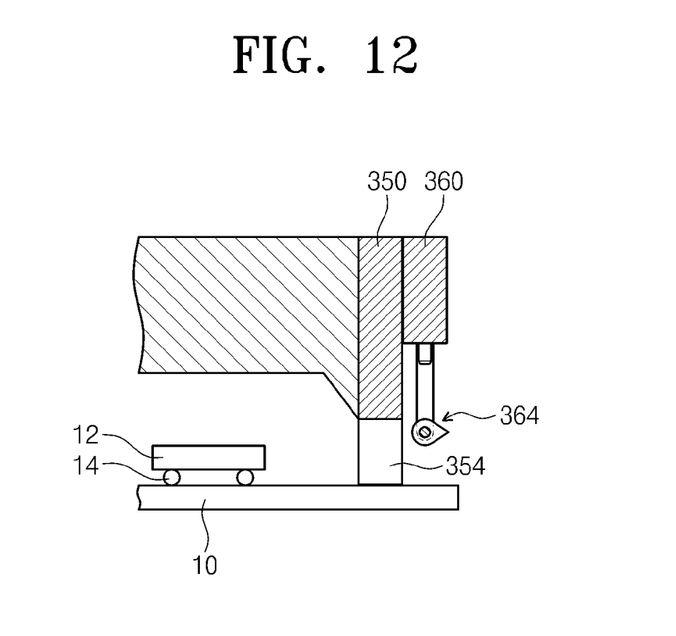
FIG. 12 is a diagram illustrating the second vent part of FIG. 10 located at a process position.

FIG. 10 is a diagram illustrating a vent part 340 according to other embodiments of the inventive concepts. FIG. 11 is a diagram illustrating a second vent part 360 of FIG. 10 located at a standby position. FIG. 12 is a diagram illustrating the second vent part 360 of FIG. 10 located at a process position.

Referring to FIG. 10, a vent part 340 may include a first vent part 350 and a second vent part 360. The first vent part 350 may have a first body 352 and a first opening 354. The first body 352 and the first opening 354 of the first vent part 350 may have the same shapes and functions as or similar shapes and functions to the first body 252 and the first opening 254 of the first vent part 250 of the FIG. 2, respectively. The second vent part 360 may include a second body 362 and a rotation unit 364. A size of the second body 362 may be smaller than that of the first body 352. The second body 362 may have a rectangular shape. For example, the second body 362 may have a horizontal length substantially the same as that of the first body 352 but may have a vertical length smaller than that of the first body 352. The horizontal length refers to a length in a direction parallel to a side surface of the mold unit on which the vent part 340 is disposed and perpendicular to the main air exhausting direction. The vertical length refers to a length in a direction vertical to the horizontal length and perpendicular to the main air exhausting direction.

The rotation unit 364 may include a cam 365, a cam shaft 366, a guide portion 367, and a follower 368. A plurality of the cams 365 may be provided. As illustrated in FIGS. 10, 11, and 12, the rotation unit 364 may include seven cams 365. However, the inventive concepts are not limited thereto. In other embodiments, the number of the cam 365 may vary. The plurality of cams 365 may be installed on the cam shaft 366. The cam shaft 366 may penetrate rotation centers of the plurality of cams 365. The cam shaft 366 may be positioned under the second body 362. The cam shaft 366 may have a length substantially the same as the horizontal length of the second body 362. A rotation axis of the cam shaft 366 may be provided to be parallel to the second body 362 (e.g., to the horizontal length of the second body 362).

The guide portion 367 may support the cam shaft 366 and connect the cam shaft 366 to the second body 362.

The guide portion 367 may move the cam shaft 366 between a standby position and a process position. As illustrated in FIG. 11, the cams 365 do not overlap with the first opening 354 when the cam shaft 366 is located at the standby position. When the cam shaft 366 is disposed at the standby position, a cross-sectional area of the first opening 354 may not be blocked or covered by the cams 365. That is, the first opening 354 may form a first air exit opening. As illustrated in FIG. 12, the cams 365 overlap with the first opening 354 when the second vent part 360 is located at the process position. When the second vent part 360 is disposed at the process position, the first opening 354 may be partially blocked or covered by the cams 365. For example, the cams 365 overlap with the first opening 354 when the cam shaft 366 is located at the process position. When the cam shaft 366 is disposed at the process position, the cross-sectional area of the first opening 354 may be partially blocked or covered by the cams 365. Alternatively, when the second vent part 360 is located at the process position, the cams 365 may overlap with a portion of the first opening 354. As a result, an uncovered first opening may form a second air exit opening having a cross-sectional area smaller than that of the first air exit opening. When the molding process is completed or substantially completed, the molding resin may outflow via the vent part. However, according to the inventive concept, the second vent part 360 may be controlled to be at process position at this time. As the second air exit opening becomes smaller, a resistance to a flow becomes greater. Thus, an outflow of the molding resin through the second air exit opening may be minimized or prevented while the air may still be effectively exhausted, thus avoiding the formation of voids in the cavity 205.

A portion of the guide portion 367 may be provided in the second body 362. One end portion of the guide portion 367 may be coupled to be capable of sliding in the inside of the second body 362. The follower 368 may be provided in the second body 362. One end portion of the follower 368 may be coupled to be capable of sliding in the inside of the second body 362. The follower 368 may rectilinearly move to rotate the cam 365. A plurality of follower 368 may be provided corresponding to the number of the cam 365. For example, the number of the followers 368 may correspond to the number of the cams 365. In another embodiment, the follower 368 may be provided at another position that is not inside of the second body 362.

In other embodiments, the rotation unit 364 of the second vent part 360 may have a shape and a structure different from those described above. For example, the cam 365 and the cam shaft 366 may be provided at another position that is not under the second body 362. The rotation axis of the cam shaft 366 may be parallel to a direction different from the horizontal direction of the second body 362. The shape and the structure of the rotation unit 364 are not limited to specific shape and structure as long as the rotation unit 364 is capable of overlapping with the first opening 354 and adjusting the cross-sectional area of the air exit opening of the vent part 340.

Figure 13:
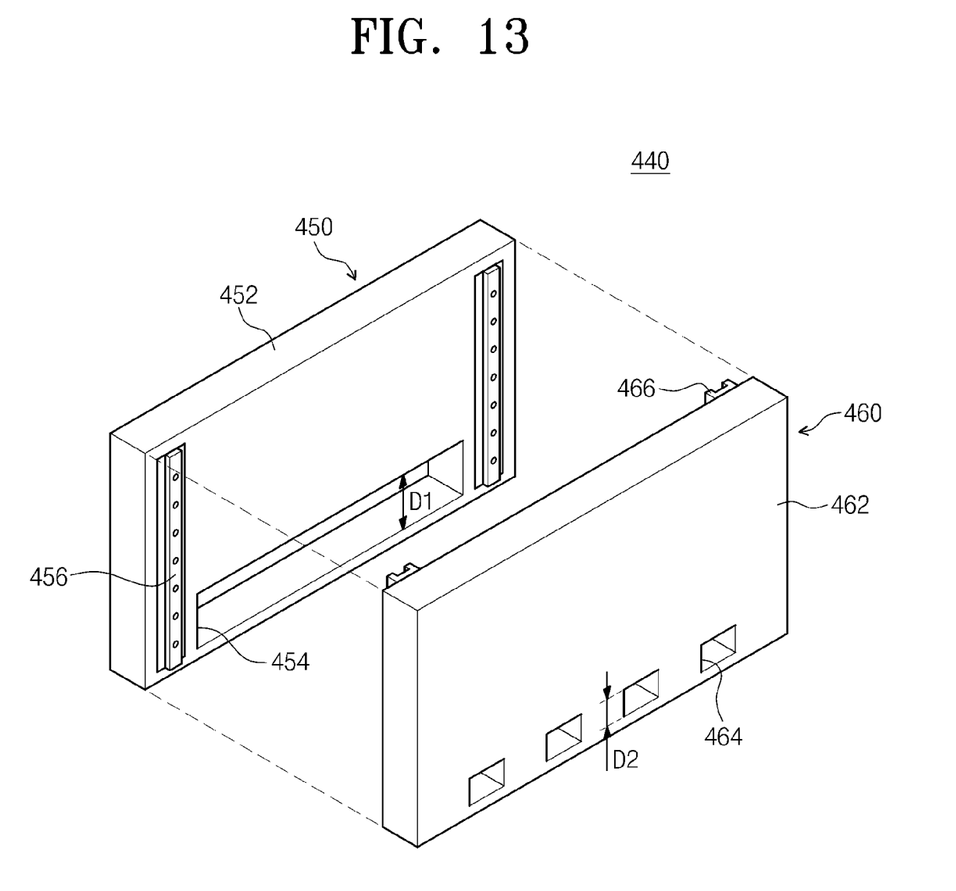
FIG. 13 is a diagram illustrating a vent part according to still other embodiments of the inventive concepts.
Figure 14:
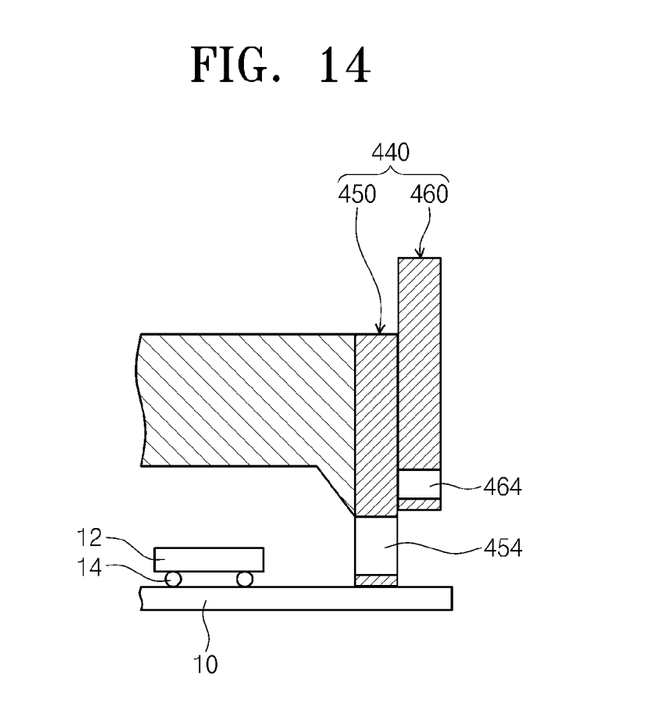
FIG. 14 is a diagram illustrating a second vent part of FIG. 13 located at a standby position.
Figure 15:
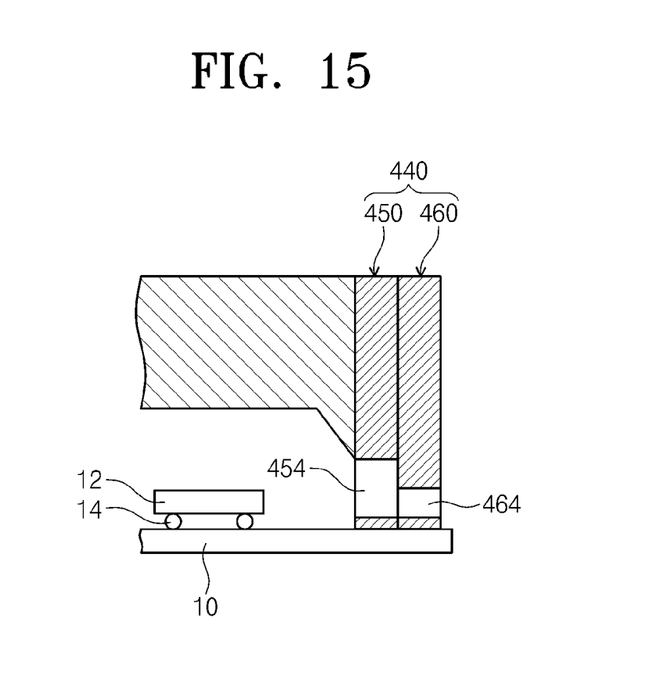
FIG. 15 is a diagram illustrating the second vent part of FIG. 13 located at a process position.

FIG. 13 is a diagram illustrating a vent part according to still other embodiments of the inventive concepts. FIG. 14 is a diagram illustrating a second vent part of FIG. 13 located at a standby position. FIG. 15 is a diagram illustrating the second vent part of FIG. 13 located at a process position.

Referring to FIG. 13, a vent part 440 may include a first vent part 450 and a second vent part 460. The first vent part 450 may include a first body 452, a first opening 454, and a guide portion 456. The first body 452 and the guide portion 456 of the first vent part 450 may have the same shapes and functions as or similar shapes and functions to the first body 252 and the guide portion 256 of the first vent part 250 of FIG. 2, respectively. The first opening 454 illustrated in FIG. 13 may be spaced apart from the bottom surface of the first body 452 by a predetermined distance. That is, four edges of the first opening 454 may be a portion of the first body 452. In some embodiments, the first opening 454 may have a quadrilateral shape. The first opening 454 may have a first width D1. In one embodiment, the first width D1 may be in a range of 80 μm to 100 μm. The second vent part 460 may include a second body 462, one or more second openings 464, and a guide 466. The second body 462 and the guide 466 of the second vent part 460 may have the same shapes and functions as similar shapes and functions to the second body 262 and the guide 266 of the second vent part 260 of FIG. 2, respectively. The second opening 464 illustrated in FIG. 13 may be spaced apart from the bottom surface of the second body 462 by a predetermined distance. That is, four edges of the second opening 464 may be a portion of the second body 462. The second opening 464 may have a quadrilateral shape. The second opening 464 may have a second width D2. The second width D2 may be different from the first width D1. The second width D2 may be smaller than the first width D1. In one embodiment, the second width D2 may be in a range of 25 μm to 40 μm.

The second vent part 460 may be movable between a standby position and a process position. The second opening 464 does not overlap with the first opening 454 when the second vent part 460 is located at the standby position, as illustrated in FIG. 14. When the second vent part 460 is disposed at the standby position, the first opening 454 may not be blocked or covered by the second vent part 460. That is, the first opening 454 may form a first air exit opening. The second opening 464 overlaps with the first opening 454 when the second vent part 460 is located at the process position, as illustrated in FIG. 15. When the second vent part 460 is disposed at the process position, a portion of the first opening 454 may be blocked or covered. As a result, an uncovered first opening may form a second air exit opening having a cross-sectional area smaller than that of the first air exit opening. When the molding process is completed or substantially completed, the molding resin may outflow via the vent part. However, according to the inventive concepts, the second vent part 360 may be controlled to be at process position at this time. As the second air exit opening becomes smaller, the resistance to flow becomes greater. Thus, the outflow of the molding resin through the second air exit opening may be minimized or prevented while the air may still be effectively exhausted, thus avoiding the formation of voids in the cavity 205.

It should be appreciated that the vent part is not limited to the illustrated embodiments. In some embodiments, the vent part may include a first vent part fixed in the mold unit and a second vent part movable with respect to the first vent part. The first opening may form a first air exit opening when the second vent part is disposed at a standby position. When the second vent part moves to a process position and covers a portion of the first opening, an uncovered portion of the first opening may form a second air exit opening having a cross-sectional area smaller than a cross-sectional area of the first air exit opening. The second vent part may have any suitable configuration that enables formation of the second air exit opening having a cross-sectional area at a process position smaller than a cross-sectional area of the first air exit opening. In one embodiment, the second vent part may be a plate with a horizontal length smaller than that of the first vent part. The plate may be a plate without an opening. The plate may be disposed at any suitable positions relative to the first vent. For example, a center of the plate may be aligned with a center of the first vent part. In another example, one side of plate may be aligned with one side of the first vent part. The process position may be a position where a bottom surface of the plate is aligned with a bottom surface of the first vent part. At the process position, the plate may be disposed to cover only a portion the first opening. As a result, the second air exit opening is formed but its cross-sectional area is smaller than that of the first air exit opening. In another embodiment, the second vent part may be a plate with a horizontal length substantially same as that of the first vent part or different from that of the first vent part. The process position may be a position where a bottom surface of the plate is spaced away from a bottom surface of the first vent part but covers a top portion of the first opening. In this position, the second air exit opening is smaller than the first air exit opening.

According to the manufacturing apparatus of the inventive concepts, the semiconductor package may be formed to have a mold layer with good sealing state.

According to the manufacturing apparatus of the inventive concepts, a crack caused by a void may be minimized or prevented. Thus, it is possible to improve mechanical and/or electrical reliability of the semiconductor package.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An apparatus for manufacturing a semiconductor package, the apparatus comprising a mold unit having:
   a first mold; a second mold coupled to the first mold, wherein an inner space of the mold unit forms a cavity;
   a supply part coupled to one side of the mold unit to supply a molding resin into the cavity; and
   a vent part coupled to another side of the mold unit opposite to the supply part to provide an exhaust path for air to exit the cavity,
   wherein the vent part includes:
      a first vent part fixed on the mold unit; and
      a second vent part movable with respect to the first vent part, and
   wherein the second vent part is coupled to the first vent part so that the first vent part and the second vent part face each other.

2. The apparatus of claim 1,
   wherein the first vent part is provided on one sidewall of the first mold or the second mold.

3. The apparatus of claim 1,
   wherein a center of the first vent part is closer to an edge of the cavity than a center of the second vent part in a main air exhausting direction.

4. The apparatus of claim 1,
   wherein the second vent part is movable with respect to the first vent part in a direction substantially perpendicular to a main air exhausting direction.

5. The apparatus of claim 4,
   wherein the first vent part includes a first opening having a first width measured in the direction substantially perpendicular to the main air exhausting direction,
   wherein the second vent part includes a second opening having a second width measured in the direction substantially perpendicular to the main air exhausting direction and the second width is different from the first width,
   wherein the second vent part is movable between a standby position and a process position,
   wherein the second opening does not overlap with the first opening when the second vent part is located at the standby position, and
   wherein the second opening overlaps with the first opening when the second vent part is located at the process position.

6. The apparatus of claim 5,
   wherein the first opening has a slit shape,
   wherein the second opening includes a plurality of quadrilateral shaped openings, and
   wherein the first width is greater than the second width.

7. The apparatus of claim 4,
   wherein the first vent part includes a first opening having a slit shape, and
   wherein the second vent part includes a rotatable rotation unit.

8. The apparatus of claim 7,
   wherein the rotatable rotation unit comprises:
      a cam coupled on a cam shaft;
      a follower configured to rotate the cam; and
      a guide portion moving the cam shaft between a standby position and a process position.

9. The apparatus of claim 8,
   wherein the first opening and the cam do not overlap with each other when the cam shaft is disposed at the standby position, and
   wherein the first opening and the cam overlap with each other when the cam shaft is disposed at the process position.

10. The apparatus of claim 3,
    wherein the supply part comprises a plunger to deliver the molding resin into the cavity,
    wherein the mold unit further comprises a control part controlling a delivery of the molding resin into the cavity from the supply part, and further controlling a position of the second vent part with respect to the first vent part, and
    wherein the position of the second vent part is set in response to a position of the plunger.

11. The apparatus of claim 10,
    wherein the plunger is controlled by the control part to start the delivery of the molding resin, and
    wherein the second vent part is controlled by the control part to be at a standby position when the first mold clamps a substrate provided in the cavity.

12. An apparatus for manufacturing a semiconductor package, the apparatus comprising a mold unit having:
    a first mold, and a second mold coupled to the first mold, wherein an inner space of the mold unit forms a cavity;
    a supply part coupled to one side of the mold unit to supply a molding resin into the cavity; and
    a vent part coupled to another side of the mold unit opposite to the supply part to provide an exhaust path for air to exit the cavity,
    wherein the vent part includes:
       a first vent part disposed at a side of the cavity to fasten a substrate provided in the cavity; and a second vent part movable in a direction substantially perpendicular to a main air exhausting direction, wherein a distance between a center of the second vent part and an edge of the cavity is greater than a distance between a center of the first vent part and the edge of the cavity in the main air exhausting direction, wherein the first vent part includes a first opening, wherein the second vent part includes an adjusting portion that covers at least a portion of the first opening to change a cross-sectional area of an air exit opening that exhausts air from the cavity as the second vent part moves along in the direction substantially perpendicular to the main air exhausting direction, and wherein the second vent part is coupled to the first vent part so that the first vent part and the second vent part face each other.

13. The apparatus of claim 12, wherein the first opening has a first width measured in the direction substantially perpendicular to the main air exhausting direction, wherein the adjusting portion includes a second opening having a second width measured in the direction substantially perpendicular to the main air exhausting direction, and different from the first width, wherein the second vent part is movable between a standby position and a process position, wherein the second opening does not overlap with the first opening in the main air exhausting direction when the second vent part is located at the standby position, and wherein the second opening overlaps with the first opening in the main air exhausting direction when the second vent part is located at the process position.

14. The apparatus of claim 12, wherein the adjusting portion comprises a rotatable rotation unit, wherein the second vent part is movable between a standby position and a process position, wherein the rotatable rotation unit does not overlap with the first opening in the main air exhausting direction when the second vent part is located at the standby position, and wherein the rotatable rotation unit overlaps with the first opening in the main air exhausting direction when the second vent part is located at the process position.

15. An apparatus for manufacturing a semiconductor package comprising:

a mold unit having a cavity corresponding to an inner space of the mold unit;

a supply part disposed on one side of the mold unit and supplying a molding resin into the cavity to encapsulate a substrate and semiconductor chips disposed in the cavity; and a vent part disposed to another side of the mold unit opposite to the supply part to provide an exhaust path for air to exit the cavity, wherein the vent part includes a first vent part fixed in the mold unit and having a first opening; and a second vent part movable with respect to the first vent part, wherein the first opening forms a first air exit opening when the second vent part is disposed at a standby position, and wherein an uncovered portion of the first opening forms a second air exit opening when the second vent part moves to a process position and covers a portion of the first opening, and wherein a cross-sectional area of the second air exit opening is smaller than a cross-sectional area of the first air exit opening.

16. The apparatus of claim 15, wherein the first opening is located at a bottom portion of the first vent part that is adjacent to a top surface of the substrate, wherein the second vent part includes a plurality of second openings located at a bottom portion of the second vent part, and wherein a total cross-sectional area of the plurality of second openings is smaller than a cross-sectional area of the first opening.

17. The apparatus of claim 16, wherein the first opening has a quadrilateral shape and three edges of the first opening are a portion of the first vent part, and wherein each of the plurality of second openings has a quadrilateral shape and three edges of each of the plurality of second openings are a portion of the second vent part.

18. The apparatus of claim 16, wherein the first opening has a quadrilateral shape and four edges of the first opening are a portion of the first vent part, and wherein each of the plurality of second openings has a quadrilateral shape and four edges of each of the plurality of second openings are a portion of the second vent part.

19. The apparatus of claim 15, wherein the first opening is located at a bottom portion of the first vent part that is adjacent to a top surface of the substrate and the second vent part includes a rotatable rotation unit, and wherein the rotatable rotation unit overlaps with the first opening in a main air exhausting direction at the process position.

* * * * *